(12) United States Patent
Fourkas et al.

(10) Patent No.: US 8,432,533 B2
(45) Date of Patent: Apr. 30, 2013

(54) METHOD AND SYSTEM FOR PHOTOLITHOGRAPHIC FABRICATION WITH RESOLUTION FAR BELOW THE DIFFRACTION LIMIT

(75) Inventors: John T. Fourkas, Bethesda, MD (US); Erez H. Gershgoren, Lapid (IL); Linjie Li, Silver Spring, MD (US); Hana Hwang, College Park, MD (US)

(73) Assignee: Univ. of MD. at College Park, College Park, MD (US)

( * ) Notice: Subject to any disclaimer, the term of this patent is extended or adjusted under 35 U.S.C. 154(b) by 436 days.

(21) Appl. No.: 12/652,410

(22) Filed: Jan. 5, 2010

(65) Prior Publication Data

US 2011/0039213 A1 Feb. 17, 2011

Related U.S. Application Data

(60) Provisional application No. 61/142,563, filed on Jan. 5, 2009.

(51) Int. Cl.
*G03B 27/72* (2006.01)
*G03F 7/00* (2006.01)

(52) U.S. Cl.
USPC ............................................ 355/69; 430/322

(58) Field of Classification Search .................. 355/53, 355/67, 71, 69; 430/311–312, 322; 438/424
See application file for complete search history.

(56) References Cited

U.S. PATENT DOCUMENTS

| | | | |
|---|---|---|---|
| 4,734,746 A * | 3/1988 | Ushida et al. | 355/53 |
| 6,913,872 B1 * | 7/2005 | Sturtevant et al. | 430/322 |
| 2005/0202352 A1 * | 9/2005 | Cyganski et al. | 430/394 |

* cited by examiner

*Primary Examiner* — Hung Henry Nguyen
(74) *Attorney, Agent, or Firm* — Sughrue Mion, PLLC

(57) ABSTRACT

A method and system for photolithography is provided. The system includes a photoresist comprising a photoinitiator and a prepolymer resin. The system further includes a first light source operable to generate at least a first beam of light which is focused on a first area of the photoresist. The first beam of light is configured to excite the photoinitiator. The system further includes a second light source operable to generate at least a second beam of light which is focused on a second area of the photoresist, the second beam of light configured to deactivate at least temporarily the photoinitiator excited by the first beam of light. The first area and second area overlap at least partially. A time difference of at least 10 ns exists between the photoinitiator being excited by the first beam of light and the photoinitiator initiating polymerization.

15 Claims, 14 Drawing Sheets

METHOD AND SYSTEM FOR PHOTOLITHOGRAPHIC FABRICATION WITH RESOLUTION FAR BELOW THE DIFFRACTION LIMIT

CROSS-REFERENCE TO RELATED PATENT APPLICATION

This application claims priority from U.S. Provisional Application No. 61/142,563 filed on Jan. 5, 2009, the disclosure of which is incorporated herein by reference in their entirety.

STATEMENT REGARDING FEDERALLY SPONSORED R&D

This invention was made under government sponsorship: H9823005C0436awarded by Department of Defense-National Security Agency. The government has certain rights in the invention.

BACKGROUND

1. Technical Field

The present invention relates to photolithography, and more particularly, to a photolithography technique and apparatus that is capable of.

2. Description of the Related Art

The following papers provide useful background information, for which they are incorporated herein by reference in their entirety, and are selectively referred to in the remainder of this disclosure by their accompanying reference numbers in triangular brackets. For example <1> refers to the 2006 paper by Thompson.

1. S. E. Thompson, S. Parthasarathy, *Mater. Today* 9, 20 (2006).
2. H. Ito, in *Microlithography—Molecular Imprinting*. (Springer-Verlag Berlin, Berlin, 2005), vol. 172, pp. 37-245.
3. S. Kawata, H. B. Sun, T. Tanaka, K. Takada, *Nature* 412, 697 (2001).
4. M. Rumi, S. Barlow, J. Wang, J. W. Perry, S. R. Marder, in *Photoresponsive Polymers I*. (2008), vol. 213, pp. 1-95.
5. C. N. LaFratta, J. T. Fourkas, T. Baldacchini, R. A. Farrer, *Angew. Chem. Int. Ed.* 46, 6238 (2007).
6. D. Yang, S. J. Jhaveri, C. K. Ober, *Mater. Res. Sci. Bull.* 30, 976 (2005).
7. J.-F. Xing et al., *Appl. Phys. Lett.* 90, 131106 (2007).
8. D. Tan et al., *Appl. Phys. Lett.* 90, 071106 (2007).
9. W. Haske et al., *Opt. Express* 15, 3426 (2007).
10. H.-B. Sun, T. Tanaka, S. Kawata, *Appl. Phys. Lett.* 80, 3673 (2002).
11. T. A. Klar, S. Jakobs, M. Dyba, A. Egner, S. W. Hell, *Proc. Nat. Acad. Sci. USA* 97, 8206 (2000).
12. S. W. Hell, *Science* 316, 1153 (2007).
13. S. W. Hell, *Nat. Methods* 6, 24 (2009).
14. C. S. Colley et al., *J. Amer. Chem. Soc.* 124, 14952 (2002).
15. J. O. Hirschfelder, C. F. Curtiss, R. B. Bird, *Molecular Theory of Gases and Liquids* (Wiley, New York, 1954), p. 890.
16. L. Li et al.,"Achieving $\lambda/20$ Resolution by One-Color Initiation and Deactivation of Polymerization" *Science*, released on Science Express, Apr. 9 2009.
17. M. W. Beijersbergen, R. P. C. Coerwinkel, M. Kristensen, J. P. Woerdman, *Opt. Commun.* 112, 321 (1994).
18. B. Harke, C. K. Ullal, J. Keller, S. W. Hell, *Nano Lett.* 8, 1309 (2008).
19. R. A. Farrer, F. L. Butterfield, V. W. Chen, J. T. Fourkas, *Nano Lett.* 5, 1139 (2005).

<16> specifically is a paper related to this disclosure and provides additional information that may have been omitted from this disclosure for conciseness.

The demand for increasingly powerful integrated circuits has spurred remarkable progress in lithographic techniques in the past decades <1>. However, progress towards higher resolution has proven to be increasingly difficult and expensive as feature sizes decrease. To improve resolution in photolithography, chemical nonlinearity can be employed to create a sharp intensity threshold for exposure <2>. However, diffractive effects still limit feature sizes in conventional photolithography to approximately a quarter of a wavelength ($\lambda$) of the light used to expose the photoresist.

Nonlinear-optical phenomena provide an alternative approach to photolithography <3-6>. In multiphoton absorption polymerization (MAP), a photoinitiator in a prepolymer resin is excited by the simultaneous absorption of two or more photons of light. The absorption probability depends upon the laser intensity to the power of the number of photons needed to cause an electronic transition, and so an ultra fast laser is generally used to provide high peak intensity at low average power. The laser is focused through a microscope objective such that the intensity of the light is only high enough to drive multiphoton absorption in the small region defined by the focal volume of the beam. In the most common implementation of MAP, multiphoton absorption initiates cross linking that hardens the prepolymer resin within the focal volume. Once you excite the photoinitiator, it drives a chain reaction that leads to the polymerization of the prepolymer resin. This polymerization can be confined to a focal volume using a focusing instrument, as discussed above. By moving this focal volume relative to the sample, complex, 3-dimensional polymeric structures can be created.

Due to the optical nonlinearity of multiphoton absorption and the existence of an intensity threshold for polymerization, MAP can be used to create volume elements (voxels) with a resolution that is considerably smaller than the wavelength of the light used. For instance, 800 nm light has been used with MAP to create voxels with a transverse dimension of 80 nm <7>, corresponding to $\lambda/10$ resolution. Even finer resolution has been reported for suspended lines, although based on the tapered nature of these lines at their attachment points it is likely that shrinkage during the developing stage plays a role in this case <8>. Using light of a shorter wavelength for MAP can also improve resolution <9>. It should be noted that due to the shape of the focal region of the laser beam, the resolution of MAP along the beam axis is usually a factor of at least three poorer than the transverse resolution <10>.

In optical fluorescence microscopy, extraordinary resolution has been achieved using a technique called stimulated emission depletion (STED) <11-13>. In STED, fluorescent molecules are excited by a short laser pulse. A second laser pulse, which is tuned to a significantly longer wavelength than the first pulse, is used to de-excite the molecules through stimulated emission. This depletion pulse must arrive after vibrational relaxation is complete in the excited electronic state but before significant fluorescence has occurred. Spatial phase shaping of the depletion beam causes de-excitation to occur everywhere except in a chosen region of the original focal volume <11-13>. This chosen region is where the fluorescence takes place and hence, fluorescence can be localized in a zone much smaller than the excitation wavelength. The size of this region depends on the intensity of the depletion beam and the corresponding degree of saturation of stimulated emission.

A potentially powerful extension of STED is to employ it for photolithography. A number of groups around the world are attempting to implement STED photolithography. However, to the knowledge of the inventors of this disclosure, no one has yet been successful.

SUMMARY

According to an exemplary embodiment, a photolithography system is provided. The system includes a photoresist comprising a photoinitiator and a prepolymer resin. The system further includes a first light source operable to generate at least a first beam of light which is focused on a first area of the photoresist. The first beam of light is configured to excite the photoinitiator. The system further includes a second light source operable to generate at least a second beam of light which is focused on a second area of the photoresist, the second beam of light configured to deactivate at least temporarily the photoinitiator excited by the first beam of light, wherein the first area and second area overlap at least partially. A time difference of at least 10 ns exists between the photoinitiator being excited by the first beam of light and the photoinitiator initiating polymerization.

According to another exemplary embodiment, a method for performing photolithography is provided. The method includes generating a first beam of light which is focused on a first area of a photoresist comprising a prepolymer resin and a photoinitiator, the first beam of light configured to excite the photoinitiator. The method further includes generating a second beam of light which is focused on a second area of the photoresist, the second beam of light configured to deactivate at least temporarily the photoinitiator excited by the first beam of light, wherein the first area and second area overlap at least partially. A time difference of at least 10 ns exists between the photoinitiator being excited by the first beam of light and the photoinitiator initiating polymerization.

BRIEF DESCRIPTION OF THE DRAWINGS

The above and other features and advantages of the present invention will become more apparent by describing in detail exemplary embodiments thereof with reference to the attached drawings in which:

FIG. 2b illustrates point spread functions of the excitation and deactivation beams of FIG. 2a.

FIGS. 3b, 3c, and 3d illustrate top-view scanning electron micrograph (SEM) of lines written using the exemplary setup of FIG. 3a.

DETAILED DESCRIPTION

Figure 1A:
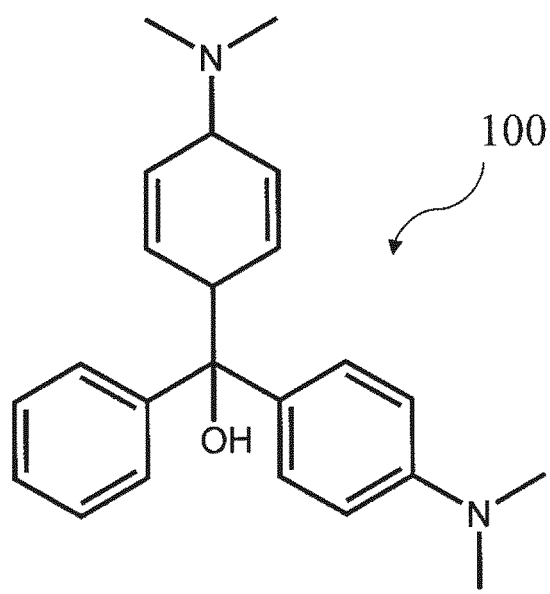
FIG. 1a illustrates an exemplary photoinitiator molecule (malachite green carbinol base).

Exemplary embodiments of the present disclosure will now be described more fully with reference to the accompanying drawings.

If one were to combine the ideas from MAP and STED to employ STED photolithography, then the idea would be to employ a photoinitiator that has the potential to be deactivated by stimulated emission before causing polymerization. In this manner, polymerization could be limited to a region comparable in size to that in STED microscopy. Indeed, because polymerization is a process that can only occur when a threshold concentration of excited molecules is produced (as opposed to fluorescence, which has no threshold), arguably STED could produce smaller features in polymerization than in fluorescence. In STED, the deactivation pulse should be relatively long (tens of picoseconds) to achieve strong stimulated emission. However, the lifetimes of the excited states of typical radical photoinitiators (i.e., those that depend on homolysis or hydrogen abstraction to create one or more reactive radicals) are on the order of 100 ps, which makes this problem a challenging one. Furthermore, typical radical photoinitiators do not have strong extinction coefficients for absorption. This means that there can be strong absorption between excited states that can more than compensate for any deactivation by stimulated emission, i.e., in typical photoinitiators the deactivation beam would enhance polymerization as opposed to inhibiting it. For a more detailed description of this problem and why selecting a photoinitiator for STED inspired photolithography is difficult, see <16>.

According to an exemplary embodiment of the present disclosure, a novel STED inspired photolithography technique is provided. According to this new technique one laser beam is used to initiate polymerization in a negative-tone photoresist based on the laser beam exciting a photoinitiator. A second laser beam is used to deactivate the photoinitiator, preventing polymerization from occurring. By spatial shaping of the phase of the deactivation beam, the polymerization can be limited to a very small region defined by the area in which the deactivation beam is not present or does not have a high enough intensity to deactivate the photoinitiator. By using a spatial phase mask in the deactivation beam it will be possible to drive deactivation everywhere but in the very center of the focal region, thereby greatly improving the resolution of MAP and creating voxels with an aspect ratio near unity. It should be possible to create voxels with diameters of 20 nm or less using 800 nm light. This new technique is referred to as Resolution Augmentation through Photo-Induced Deactivation (RAPID) lithography. Optimization of the beam diameters, the phase mask, and the wavelengths employed should lead to further improvements in the resolution attainable with RAPID lithography.

In the above exemplary embodiment, the photoinitiator may be a compound that has a large absorption cross-section (and a corresponding high extinction coefficient) and low fluorescence quantum yield. A low fluorescent quantum yield may be a range of 0.1 or less. A high extinction coefficient may be a molar extinction coefficient of greater than 50,000/M-cm. Preferably, the molar extinction coefficient is greater than 100,000/M-cm. The absorption cross-section can be easily calculated from the extinction coefficient.

In contrast to STED, in RAPID the deactivation of the photoinitiator is not accomplished by stimulated emission. Instead, a molecule with a large extinction coefficient that can become an electron acceptor upon electronic excitation is used as the photoinitiator. One or more of the radicals that are generated in this manner (light absorption by the photoinitiator) can then initiate polymerization. However, a second pulse of light can lead to deactivation of the photoinitiator. Due to the high extinction coefficient, absorption between excited states may not play a role in this process. Furthermore, if the radical created by the photoinitiator is relatively stable, deactivation can be accomplished over a period of tens of nanoseconds or even microseconds, i.e., before the photoinitiator is able to initiate polymerization, the photoinitiator is deactivated and the time for which the photoinitiator does not initiate polymerization after being excited is greater than at least ten nanoseconds. Such a time lag between excitation and initiating of polymerization may be accomplished in a plurality of ways. For example, the photoinitiator may transform from a first state in which the photoinitiator is incapable of initiating polymerization to a second state in which the photoinitiator initiates polymerization, in response to excitation by the excitation beam. The lifetime of the second state may be greater than 10 ns. Long-pulsed or even continuous-wave laser sources may therefore be suitable for deactivation. Deactivation as used in this disclosure refers to the inability of the photoinitiator molecules to initiate and aid in polymerization.

The exemplary embodiment will be described in further detail with reference to FIG. 1. In FIG. 1(a), the exemplary photoinitiator 100 used is malachite green (MG) carbinol base. The MG molecule used as the photoinitiator has a large absorption cross-section (extinction coefficient of about 150,000/M-cm), which is atypical of commonly used radical photoinitiators, and can still generate radicals upon photoexcitation. Further, the exemplary MG molecule has a low fluorescence quantum yield. The MG molecule used as the photoinitiator may be selected from the Malachite green family including Malachite green carbinol base, Malachite green carbinol base hydrochloride, Malachite green oxalate, Malachite green hydrogen sulfate, Malachite green acetate, and Malachite green benzoate.

Figure 1B:
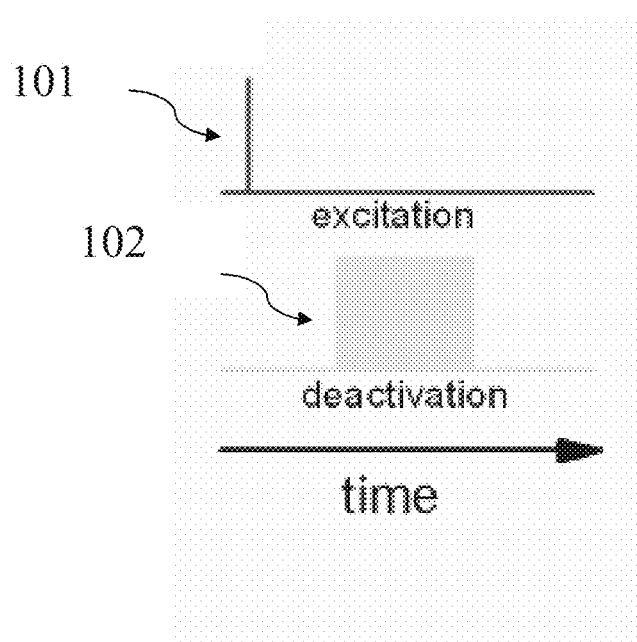
FIG. 1b illustrates an exemplary timing scheme for RAPID.
Figure 1C:
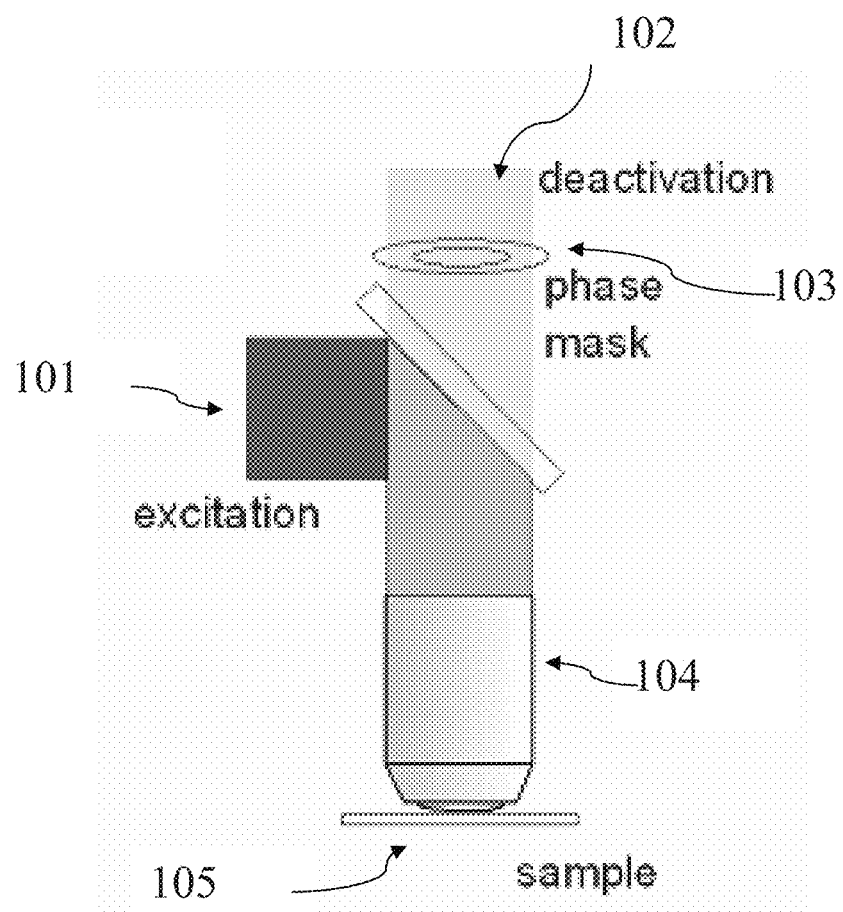
FIG. 1c illustrates an exemplary schematic experimental setup for RAPID.

An exemplary setup for RAPID is described in FIG. 1c. An excitation beam 101 and a deactivation beam 102 are focused using a focusing device 104 on a sample 105. The deactivation beam is passed through a phase mask 103 for phase shaping. However, in another exemplary embodiment, multiple phase-masked deactivation beams 102 may be used. Exemplarily, the excitation beam 101 and the deactivation beam may be from a single source or may be from separate sources. The excitation beam 101 and deactivation beam 102 in the current exemplary embodiment are laser beams output by one or more laser sources. The exemplary sample is a photoresist, which may be a mixture of a prepolymer resin and a photoinitiator.

An exemplary composition of the photoresist may include 1.6% weight percent of MG carbinol base in a mixture of acrylate monomers, such as 40% weight percent SR-368 (tris (2-hydroxy ethyl) isocyanurate triacrylate) and 60% weight percent SR-499 (ethoxylated(6) trimethylolpro-pane triacrylate) [the 40% and 60% are before the addition of the initiator). In the above exemplary composition, MG carbinol base is the photoinitiator and the acrylates are included in the prepolymer resin. The prepolymer resin may be a combination of one or more acrylates, methacrylates, urethanes, acrylamides, etc.

The excitation beam 101 leads to excitation of the photoinitiator, which initiates a chain reaction that may initiate polymerization. Excitation of the photoinitiator is accomplished by absorption of two photons of light to the red of the absorption spectrum of MG. Exemplarily, the wavelength of light used for both the excitation beam 101 and deactivation beam 102 is between 730 and 840 nm, and is in the form of an ultrafast pulse from a titanium:sapphire laser. FIG. 1b shows that the excitation beam 101 and deactivation beam may be spaced apart in time.

Figure 2A:
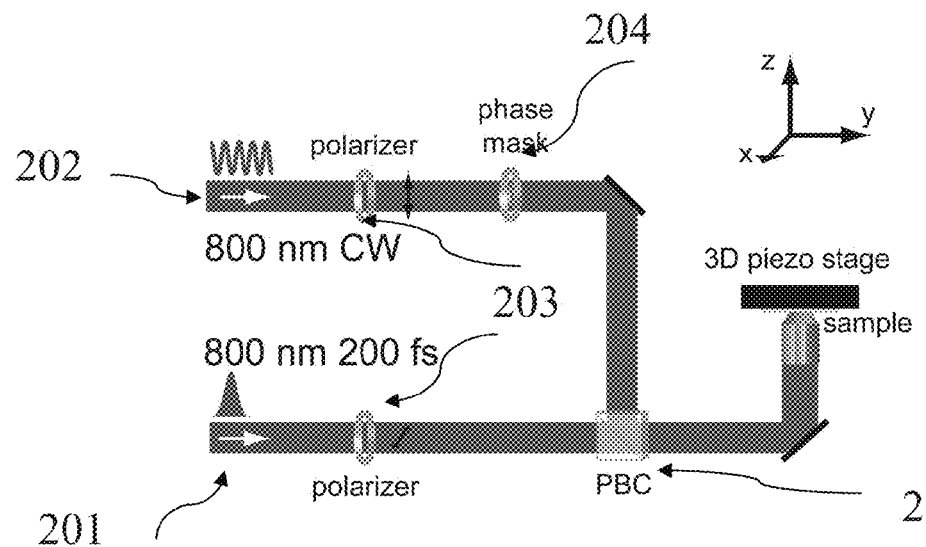
FIG. 2a illustrates an exemplary schematic experimental setup for RAPID lithography with a pulsed excitation beam and a phase-shaped, CW deactivation beam.
Figure 2B:
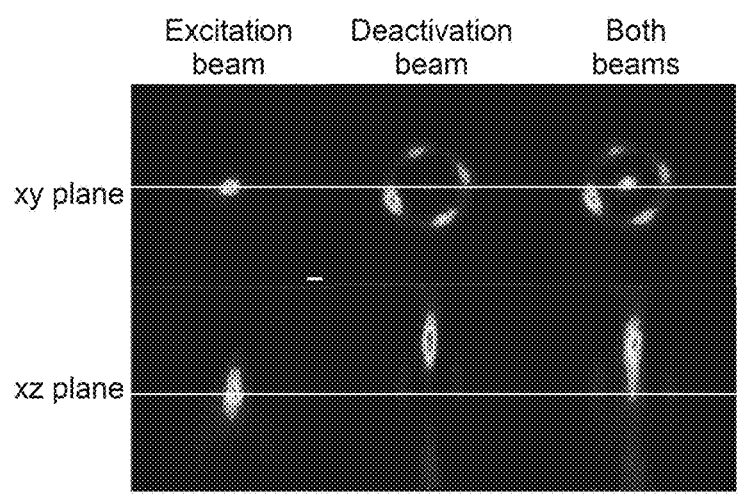

FIG. 2 shows another exemplary embodiment of the present disclosure. This exemplary embodiment is described after the description of FIG. 3.

Figure 3A:
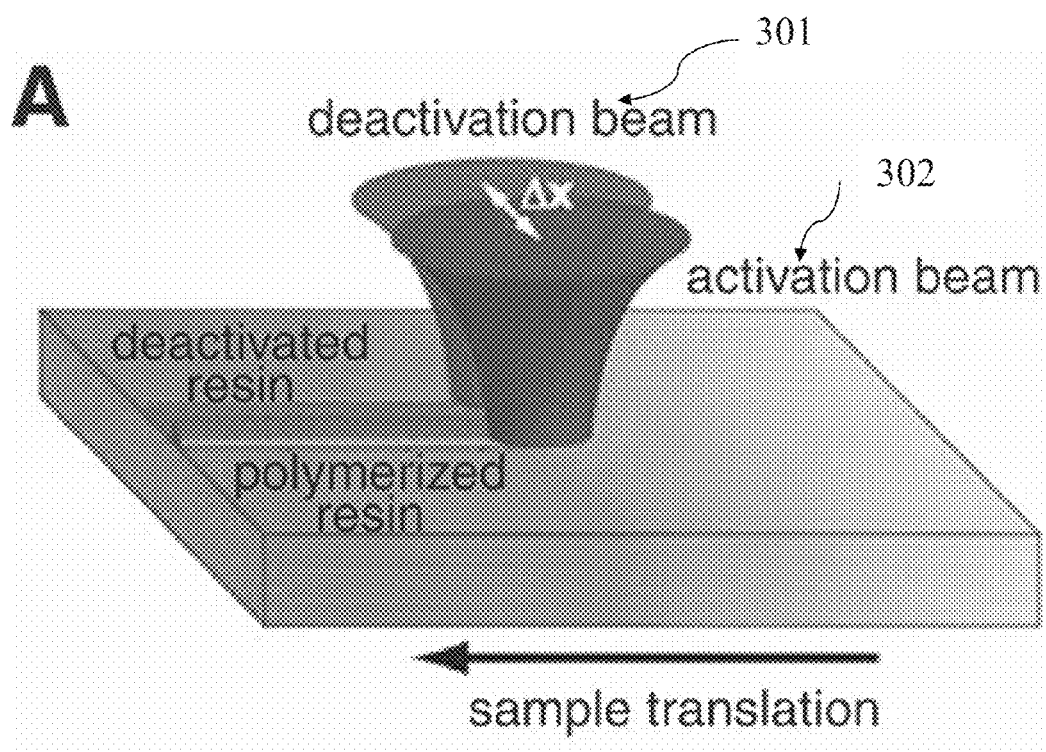
FIG. 3a illustrates an exemplary experimental setup for demonstrating photoinduced deactivation of photopolymerization.

Next, some preliminary experimental results are described with reference to FIG. 3. FIG. 3a shows a schematic illustration of the experimental setup for demonstrating photoinduced deactivation of photopolymerization. The excitation beam 301 and deactivation beam 301 are focused in the prepolymer resin with a lateral separation of Δx. The substrate is translated perpendicular to the separation axis to fabricate polymer lines. For these experiments two tunable, synchronized Ti:sapphire lasers were used, both of which were tuned to 800 nm. The excitation pulse duration was approximately 200 fs and the deactivation pulse duration was approximately 50 ps.

The prepolymer resin includes malachite green carbinol base, and it was found that the deactivation beam could reduce polymerization or, at high enough intensity, inhibit polymerization completely. The deactivation beam 302 was examined for wavelengths ranging from 760 nm to 840 nm, and in all cases it was able to inhibit polymerization. The capacity to initiate polymerization with femtosecond pulses and inhibit polymerization with considerably longer pulses of the same wavelength confers the advantage that the entire process can be accomplished with the output of a single ultrafast laser if desired.

Figure 3B:
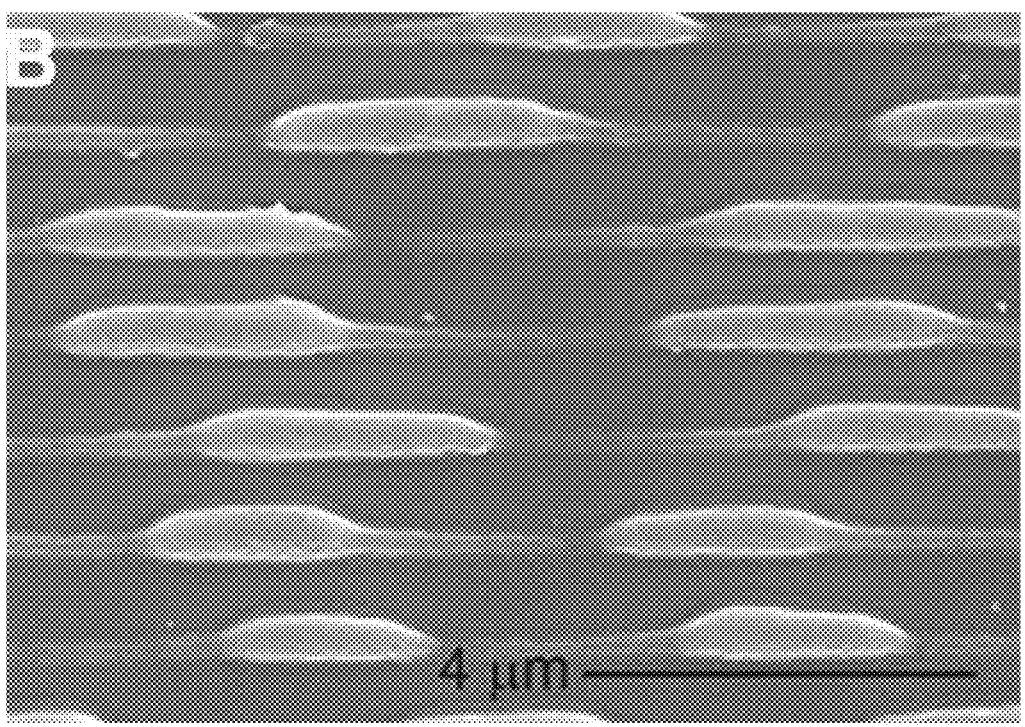

To demonstrate photoinduced deactivation of polymerization, polymer lines were fabricated with excitation and deactivation beams that were either offset or spatially coincident (FIG. 3a). Shown in FIG. 3b are lines drawn with an offset between the beams. The deactivation beam 302 was blocked at regular periods with an optical chopper wheel. The resultant modulation of the polymer line demonstrates the effectiveness of the deactivation process. Specifically, the top-view scanning electron micrograph (SEM) of polymer lines written using offset (Δx>0), 200-fs excitation pulses and 50 ps deactivation pulses. The deactivation beam was chopped. The excitation power was 7 mW and the deactivation power 70 mW.

Figure 3C:
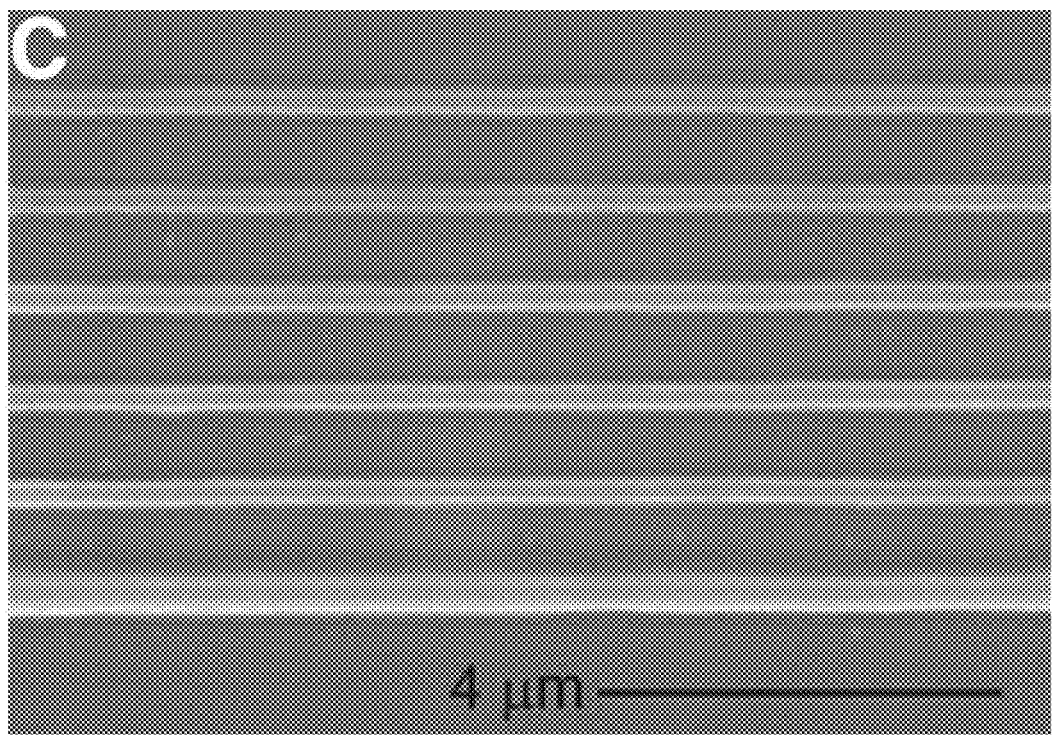

In FIG. 3c, lines are shown that were drawn by scanning the sample stage at constant velocity with no deactivation beam (bottommost line) and with different timings between the excitation and deactivation pulses. The deactivation beam was set at an intensity that resulted in only partial inhibition of polymerization so that the dependence of the deactivation efficiency on timing could be determined. The efficiency of deactivation did not change noticeably for excitation/deactivation delays between 0 and 13 ns. The bottom line was written without a deactivation beam, and the remaining lines were with written with delay times, from bottom to top, of 7 ns, 12 ns, 0 ns, 1 ns and 6 ns; all delay uncertainties are <1 ps. The excitation power was 7 mW and the deactivation power 50 mW. This result implies that the photoinitiator goes through an intermediate state between optical excitation and the initiation of polymerization. The lifetime of this intermediate state must be considerably longer than 13 ns, making it likely that the state is deactivated through a process other than stimulated emission. Once a structure was polymerized it could not be erased by subsequent application of the deactivation beam, indicating that for deactivation to be effective it must occur while the dye molecule is in this intermediate state. However, a region in which deactivation was used to prevent polymerization can be polymerized subsequently by the excitation beam.

Given the high peak intensity of the short excitation pulses, two-photon initiation dominates over one-photon deactivation for short-excitation pulses. Due to their considerably greater duration and correspondingly weaker peak intensity, the energy of 50 ps deactivation pulses can be much greater than that of the excitation beam without causing polymerization. Thus, for these longer pulses deactivation can dominate over initiation. Use of a CW beam allows for the use of a correspondingly larger energy for deactivation.

Even with 50 ps pulses, at high enough average power the deactivation beam 302 caused increased polymerization, presumably through two-photon absorption. Based on the observation that delays as long as 13 ns did not affect the deactivation efficiency, it was tested whether deactivation could be driven by CW radiation, for which considerably higher deactivation intensities would be feasible.

Figure 3D:
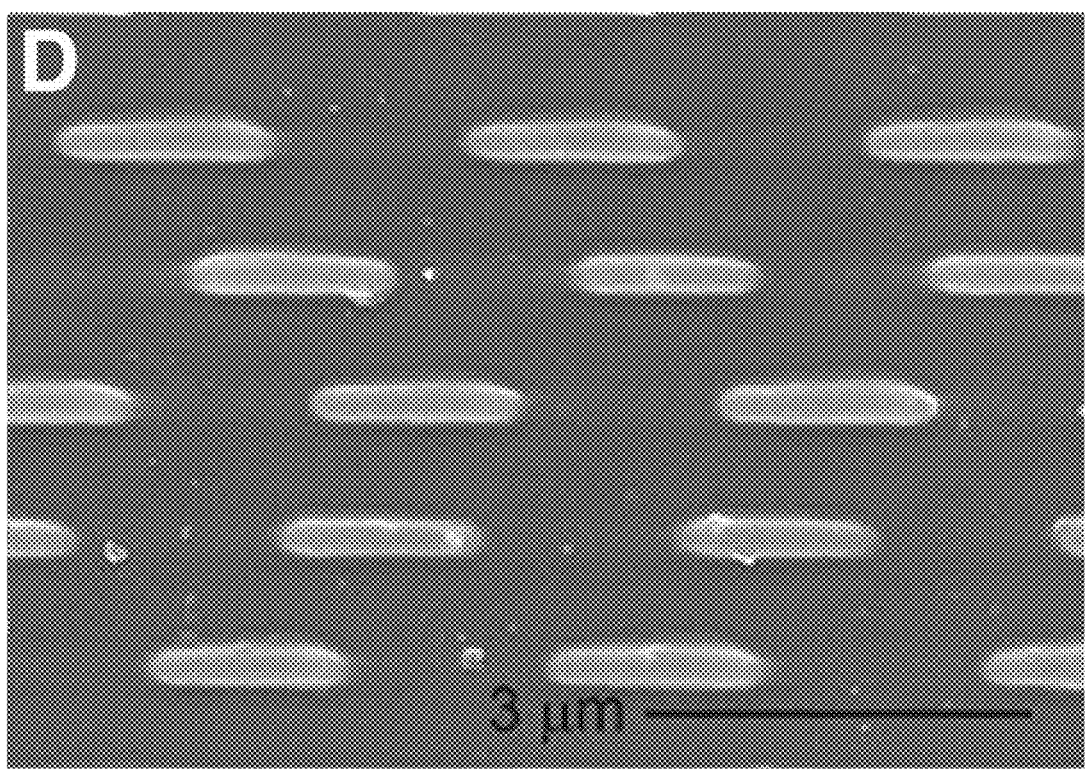

Exemplarily, 200 fs excitation pulses and a CW deactivation beam that was chopped to turn polymerization off and on were used. The excitation power was 5 mW and the deactivation power 34 mW. As shown in FIG. 3d for spatially coincident excitation and deactivation beams (with the latter beam chopped), CW radiation is indeed effective for deactivation. This result is important because it allows RAPID to be performed without the need to establish any timing between the excitation and deactivation lasers, and also implies that RAPID lithography should be feasible with single-photon absorption using CW excitation and deactivation beams.

FIG. 3 gives a clear indication of how using different spatial intensity patterns for these two beams can improve resolution. Therefore, based on the exemplary embodiment described in FIG. 2, spatial phase shaping of the deactivation beam to alter its intensity distribution in the focal region was explored. An exemplary experimental setup for RAPID lithography with a pulsed excitation beam 201 and a phase-shaped, CW deactivation beam 202 is shown in FIG. 2a. This setup employs two Ti:sapphire lasers tuned to 800 nm, one operating in pulsed mode for multiphoton excitation and one operating in CW mode for deactivation. The outputs of the two lasers excitation beam 201 and deactivation beam 202 were set to orthogonal polarizations using polarizers 203 and combined in a polarizing beam cube 206. The beams were focused into the sample with a high-numerical-aperture objective, the back aperture of which was overfilled by the excitation beam 201 and filled completely by the deactivation beam 202.

A spatial phase mask 204 <11> that is designed to improve resolution along the optical axis z of the fabrication system is used in conjunction with the deactivation beam 202. The mask 204 consists of a flat substrate with a central circular region of an appropriate thickness to create a half-wave delay at 800 nm. The point-spread functions (PSFs) of the two beams were measured and proper overlap was ensured using multiphoton-absorption-induced luminescence (MAIL) <19> from a gold nanoparticle (FIG. 3B). The majority of the intensity of the deactivation beam lies outside of the center of the focal region. As can be seen from the images in FIG. 3B, there is no overlap between the excitation and deactivation PSFs in the xy plane, but there is considerable overlap along the z direction. False-color, multiphoton-absorption-induced luminescence images of the cubes of the point-spread functions of the excitation beam, the deactivation beam, and both beams together are shown in FIG. 3b. The long white lines indicate the approximate centers of the focal regions. The scale bar in the upper left image is 200 nm.

To assess the resolution enhancement of RAPID lithography with this phase mask, the sizes and shapes of voxels created with different excitation and deactivation powers were studied. In order to observe the voxel shapes, an ascending-scan method, in which identical, isolated voxels are created at different heights relative to the substrate was employed <10>. At some particular height the voxel will barely be attached to the substrate. If the aspect ratio of the voxel is greater than unity it will fall over, allowing its dimensions to be determined readily with scanning electron microscopy (SEM) or atomic force microscopy (AFM).

FIG. 4 shows SEM images from one such voxel study at a fixed excitation power (time averaged) of 10 mW and different deactivation beam powers. As would be expected for the phase mask employed, deactivation did not have a substantial effect on the transverse dimensions of the voxels. FIGS. 4a-4f show SEM images of voxels created with deactivation beam powers of 0 mW, 17 mW, 34 mW, 50 mW, 84 mW and 100 mW, respectively. It can be seen that with increasing deactivation power the z dimension of the voxel decreased more than three-fold. For a given excitation intensity, deactivation intensity, and height relative to the substrate, voxels were either present at every exposed spot or were absent at every exposed spot. The variation in voxel dimensions for a fixed set of fabrication parameters was approximately ±5%.

Figure 4A:
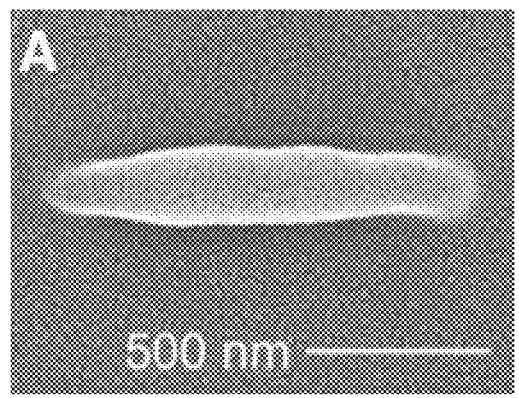
FIGS. 4a-4k show additional experimental results.
Figure 4B:
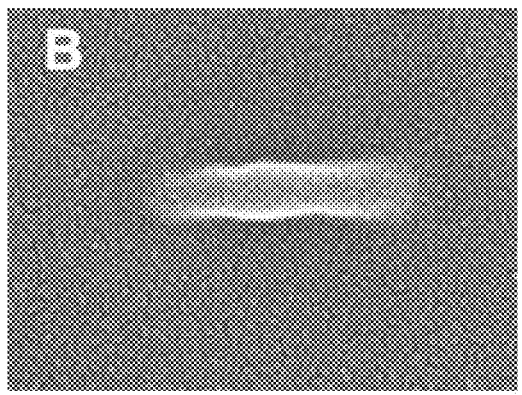
Figure 4C:
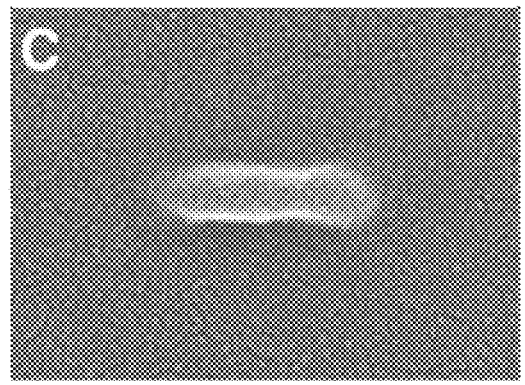
Figure 4D:
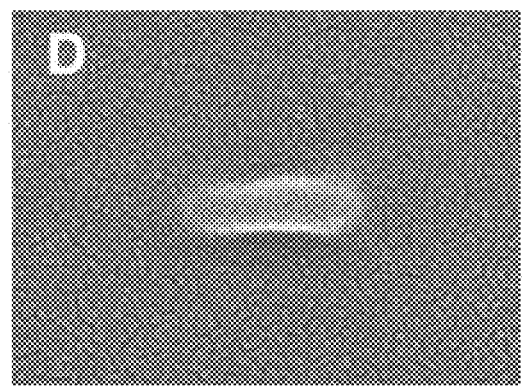
Figure 4E:
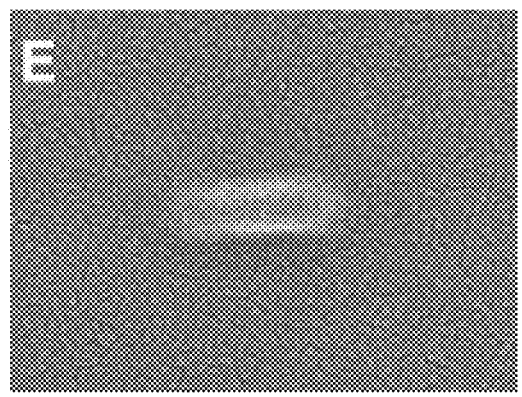
Figure 4F:
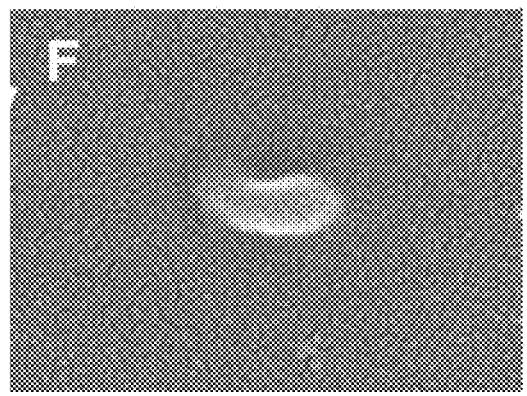
Figure 4G:
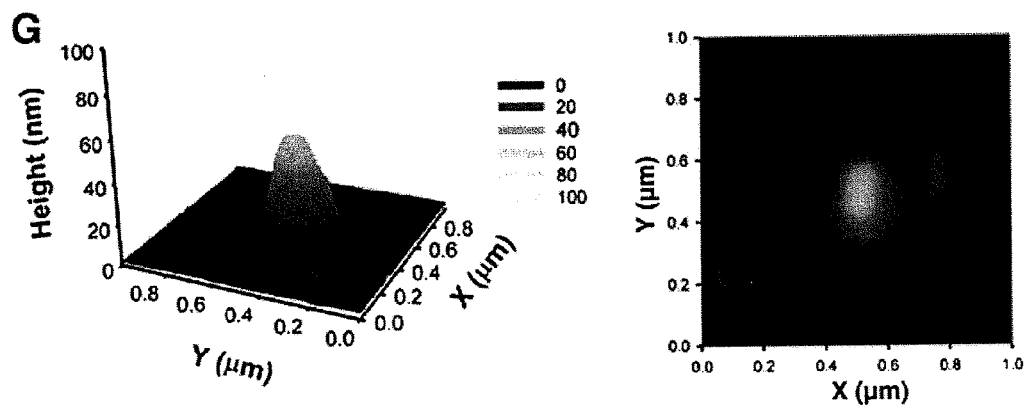
Figure 4H:
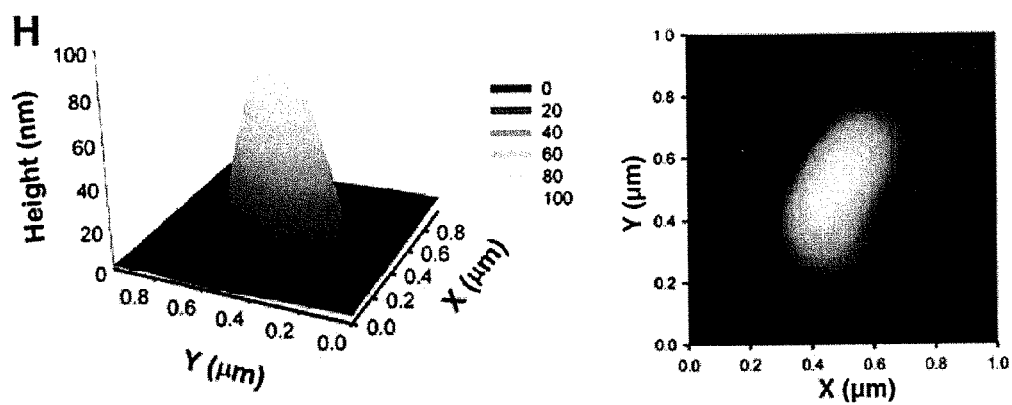

Because the voxel studies were performed on a glass cover slip (which is transparent but not electrically conductive), voxels had to be coated with metal for SEM imaging. Thus, to measure the smallest voxels that could be fabricated an AFM was used so that the metal coating step could be avoided. Shown in FIG. 4G is the smallest voxel that was fabricated reproducibly with RAPID lithography using 800 nm light. For comparison, the corresponding smallest voxel that could be fabricated reproducibly without the deactivation beam is shown in FIG. 4H. While the voxel in FIG. 4G is standing, the voxel in FIG. 4H has fallen over due to its high aspect ratio.

Figure 4I:
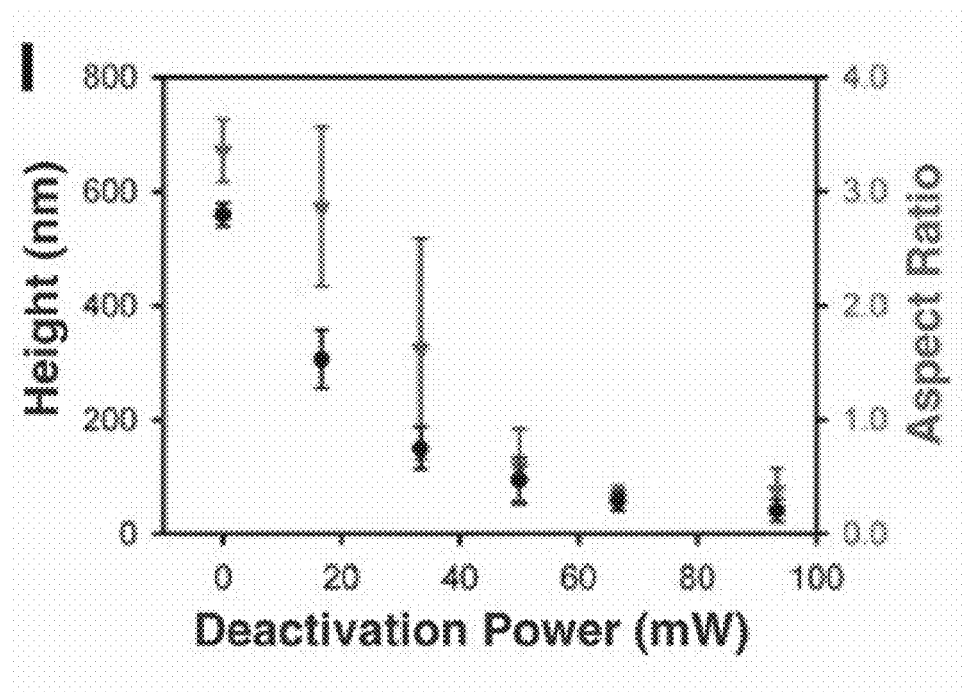
Figure 4J:
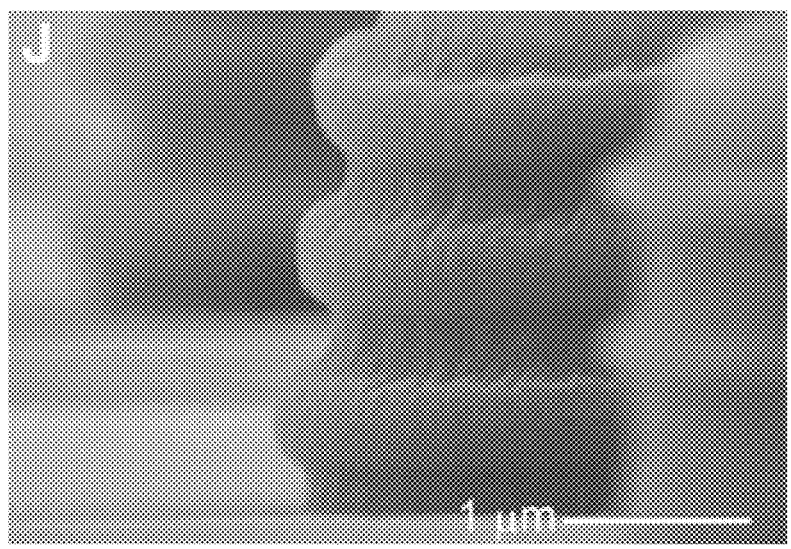
Figure 4K:
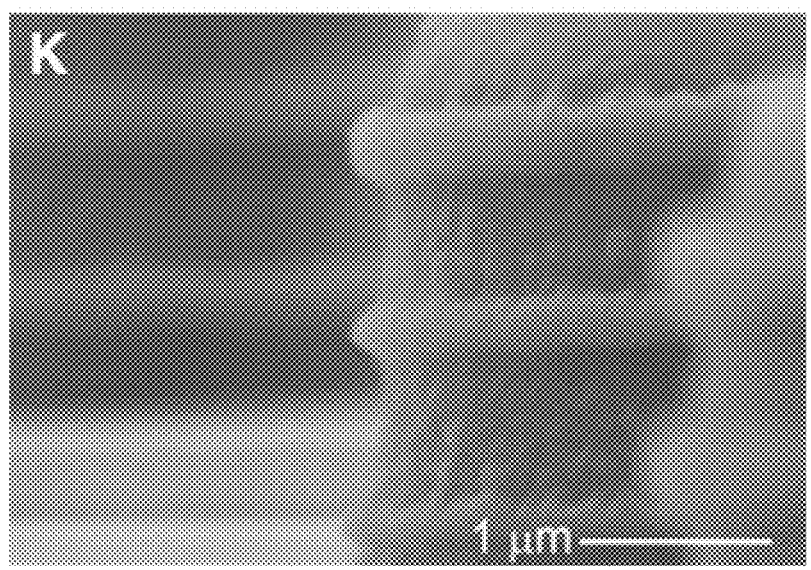

In FIG. 4I the height and aspect ratio of voxels measured in AFM experiments as a function of deactivation power, are plotted. Note that when the aspect ratio of a voxel is less than unity, it will not fall over even when barely attached to the substrate. For the excitation power used in FIG. 4I, the voxel height could be reduced from nearly 600 nm with no deactivation beam to 40 nm with a deactivation power of 93 mW, representing resolution of $\lambda/20$. The aspect ratio was correspondingly reduced from over 3 to 0.5. The rings on the towers shown in FIG. 4J (fabricated with conventional MAP) and FIG. 4K (fabricated with RAPID) demonstrate that enhancement of resolution and aspect ratio can also be achieved in 3-dimensional structures.

It has been observed that above a certain excitation power, it becomes impossible to inhibit polymerization fully even at high deactivation beam power. This result implies that there are two different channels for photoinitiation, only one of which is deactivatable. If the concentration of radicals from the non-deactivatable channel is below the polymerization threshold, the deactivation beam can inhibit polymerization completely. It has been observed that the irreversible channel is weaker in more viscous resins. While research into the nature of the photophysics of this system is ongoing, it is believed that excitation of the photoinitiator leads to an electron transfer process that creates two relatively stable radicals. Due to their stability, these radicals initiate polymerization on a time scale that is considerably longer than the 13 ns repetition time of the laser system. So long as the radicals do not diffuse apart, absorption of a photon from the deactivation beam can lead to back transfer of the electron, depleting the radicals before they can react. If the radicals do diffuse apart, deactivation can no longer occur, accounting for the non-deactivatable channel.

With the phase mask used here, RAPID lithography can clearly produce features with heights as small as $\lambda/20$ along the optical axis. In analogy with results from STED microscopy, comparable transverse resolution should be attainable by employing a different phase mask, such as a spiral phase element <17>. By using two phase-masked deactivation beams <18> it should further be possible to attain this resolution in all dimensions. The use of shorter excitation and deactivation wavelengths should improve resolution further. A current limiting factor in the resolution attainable is that even a CW deactivation beam can cause polymerization at high enough intensity. Since the resolution enhancement of RAPID lithography is based on an optical saturation effect, making the deactivation process more efficient should lead to finer features. In principle, the resolution of RAPID will ultimately be limited by material properties, particularly the minimum size of a self-supporting polymer voxel. With this limitation in mind, it is believed that resolution on the order of 10 nm can be attained through full optimization of the photoresist properties and the optical configuration. Resolution on this scale may be attractive for next-generation lithography, particularly considering that RAPID lithography can be implemented with a table-top instrument.

Exemplarily, a plurality of phase masked (also referred to as phase shaped) de-activation beams may be used, that is a plurality of de-activation beams may be used that are phase masked individually. Further, the excitation beam may also be phase shaped. Further, a plurality of excitation and deactivation beams may be used. One or more excitation and deactivation beams may be generated by a single or a plurality of light sources, preferably the light sources are laser sources. Exemplarily, in addition to or instead of a phase mask an amplitude mask may also be used for the deactivation beam and/or the excitation beam. Exemplarily, the wavelengths for single photon photoinitiation may be between 350-450 nm and the wavelengths for two photon photoinitiation may be between 700-900 nm.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A photolithography system, the system comprising:
   a photoresist comprising a photoinitiator and a prepolymer resin;
   a first light source operable to generate at least a first beam of light which is focused on a first area of the photoresist, the first beam of light configured to excite the photoinitiator; and
   a second light source operable to generate at least a second beam of light which is focused on a second area of the photoresist, the second beam of light configured to deactivate at least temporarily the photoinitiator excited by the first beam of light,
   wherein the first area and second area overlap at least partially,
   wherein a time difference of at least 10 ns exists between the photoinitiator being excited by the first beam of light and the photoinitiator initiating polymerization.

2. The system according to claim 1, wherein the photoinitiator is selected from a group consisting of Malachite green carbinol base, Malachite green carbinol base hydrochloride, Malachite green oxalate, Malachite green hydrogen sulfate, Malachite green acetate, and Malachite green benzoate.

3. The system according to claim 1, wherein the photoinitiator is excited by the first beam of light by one of single photon absorption and two photon absorption.

4. The system according to claim 1, wherein the photoresist is one of a positive tone and a negative tone photoresist.

5. The system according to claim 1, wherein the photoinitiator has a fluorescence quantum yield less than 0.1 and has an extinction coefficient greater than 50,000/M-cm.

6. The system according to claim 1, further comprising a phase mask configured for phase shaping the second beam of light prior to the second beam of light deactivating the photoinitiator.

7. The system according to claim 1, wherein the first and second sources of light are laser sources generating the first and second beams of light.

8. The system according to claim 7, wherein the first light source is operating in pulsed mode and the second light source is operating in continuous wave mode.

9. The system according to claim 7, wherein the first light source and the second light source are operating in pulsed mode.

10. The system according to claim 7, wherein the first light source and the second light source are operating in continuous wave mode.

11. The system according to claim 1, wherein the wavelength of the first and second beam of light is between 700 nm and 900 nm.

12. The system according to claim 1, wherein the wavelength of the first and second beam of light is between 350 nm and 450 nm.

13. The system according to claim 7, wherein the first and second sources of light correspond to a single light source.

14. The system according to claim 7, wherein the first light source is operating in continuous wave mode and the second light source is operating in pulsed mode.

15. The system according to claim 1, wherein the time difference of at least 10 ns is an average time difference.

* * * * *